United States Patent
Hashiguchi

(10) Patent No.: US 6,766,742 B2
(45) Date of Patent: Jul. 27, 2004

(54) IMAGE EXPOSURE APPARATUS

(75) Inventor: Akihiro Hashiguchi, Kanagawa (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/700,634

(22) Filed: Nov. 5, 2003

(65) Prior Publication Data

US 2004/0099165 A1 May 27, 2004

(30) Foreign Application Priority Data

Nov. 26, 2002 (JP) ........................... 2002-342681

(51) Int. Cl.⁷ .................................. B41F 1/00
(52) U.S. Cl. ................... 101/477; 101/486; 271/238; 271/250
(58) Field of Search ............... 271/3.03, 238, 271/248, 250, 255, 258.01; 101/477, 485, 486, 118

(56) References Cited

U.S. PATENT DOCUMENTS 5,255,607 A * 10/1993 Nishiyama et al. ...... 101/463.1

2001/0013285 A1 * 8/2001 Shoji ...................... 101/116
2003/0056671 A1 * 3/2003 Hashiguchi ............... 101/477
2003/0106448 A1 * 6/2003 Uemura .................... 101/477
2004/0020386 A1 * 2/2004 Koyanagi et al. ......... 101/415.1

FOREIGN PATENT DOCUMENTS

JP   2001-356489 A   12/2001
JP   2003-095489 A   4/2003

\* cited by examiner

Primary Examiner—Andrew H. Hirshfeld
Assistant Examiner—Kevin D. Williams
(74) Attorney, Agent, or Firm—Sughrue Mion, PLLC

(57) ABSTRACT

An image exposure apparatus has a width direction moving unit including: a moving member moved by a driving motor in the width direction of the printing plate; a pressurizing unit for enabling the conveying pin supported by the moving member in a direction of the printing plate; a plurality of pin position detecting sensors for detecting a moving position of the conveying pin wherein the moving member moves forward in the direction of the printing plate and the conveying pin is moved by coming into contact with the width direction edge of the printing plate; and a control unit having an input unit for entering a sort of the printing plate. The control unit stops the driving motor in accordance with a detection signal from the pin position detection sensor associated with the sort of the printing plate entered through the input unit of the pin position detecting sensors.

6 Claims, 10 Drawing Sheets

IMAGE EXPOSURE APPARATUS

BACKGROUND OF THE INVENTION

1. Field of the Invention

The present invention relates to an image recording apparatus for recording an image on a printing plate, and particularly to an image exposure apparatus having an apparatus for performing the positioning in a state that the printing plate is put on a plate feed guide.

2. Description of the Related Art

The conventional image exposure apparatus is to record (expose) an image on a printing plate consisting of an aluminum foil sheet. In the image exposure apparatus, a plate feed conveying section is provided with a reversing unit and a conveyer. The reversing unit transmits to the conveyer a printing plate drawn out from a cassette through rolling up on a reversing roller. The conveyer conveys obliquely below the printing plate put on a conveying belt while supporting the printing plate in cooperation with the roller so that the top of the printing plate is in contact with a pin roller. When the printing plate is in contact with the pin roller, the plate feed conveying section causes a positioning motor to operate so that the reversing unit moves together with the conveyer on a parallel basis. Thus, the printing plate is in contact with the pin roller to perform the positioning of the printing plate. The printing plate subjected to the positioning is fed to a puncher by the conveyer in the leading edge (cf. for example, Japanese Patent Application Laid Open Gazette TokuKai. 2001-356489 (Page 1, FIG. 2).

According to the image exposure apparatus as mentioned above, the printing plate, which is put on a plate feed guide formed as a plate, is conveyed to a punch section to form punched holes on the printing plate through performing a punch processing. The punched holes are used for a determination of positioning in a printing processing, which is the continuation step. The printing plate, which is put on the plate feed guide, is conveyed to an exposure section and is wound on a rotating drum of the exposure section. Then the printing plate is subjected to an exposure processing.

By the way, there is a necessity for making sure of reproduction quality of exposure recording positions, in which the exposure recording positions on a plurality of printing plates are given with uniformity in its entirety. For this reason, before the exposure processing by the exposure section, there is performed the following positioning in a state that the printing plate is put on the plate feed guide.

As shown in a part (a) of FIG. 10, a printing plate 12 is put on a plate feed guide 20, a front edge of the printing plate 12 is in contact with a pair of positioning pins 48 located in the vicinity of a punch section (not illustrated), and a width direction moving unit 39 provided on the plate feed guide 20 advances in the direction of the printing plate 12. At a moving member 114 of the width direction moving unit 39, a connecting lever 115 is rotatably mounted on a fulcrum 116. At the connecting lever 115, a conveying pin 42 is rotatably supported on a supporting shaft 40. A pressurizing spring 119 enables the connecting lever 115 anticlockwise (the arrow direction in FIG. 10), that is, in a direction that the conveying pin 42 moves forward.

As shown in a part (b) of FIG. 10, when the width direction moving unit 39 moves forward, the conveying pin 42 is elastically in contact with a width direction edge of the printing plate 12 to move in the right direction, so that the right edge of the printing plate 12 is in contact with a reference pin 36 and thereby carrying out a positioning in the horizontal direction.

Recently, in an image exposure apparatus for recording an image on a printing plate, there is a tendency that sorts of size and thickness of the printing plate, with which one image exposure apparatus is capable of coping, are increased. For example, there are used printing plates of 0.15 mm, 0.2 mm, 0.24 mm, 0.3 mm, and 0.4 mm in thickness, and width 300 mm×length 458 mm in smallest one and width 1310 mm×length 1050 mm in largest one with respect to the size. Of course, the smaller in thickness or the larger in size, the buckling deformation strength more weakens.

Hitherto, the pressure applied to the printing plate 12 via the conveying pin 42 is determined by the pressurizing spring 119 and is constant pressure. Accordingly, hitherto, the pressurizing spring 119 is set up in such an extent that the printing plate 12 is subjected to the buckling deformation and is pressed against the reference pin 36. This scheme is available in the event that the sort of the printing plate is not many. But the smaller in thickness or the larger in size and the larger in width make it difficult to be matched with only the spring force of the pressurizing spring 119. More specifically, too weak spring force of the pressurizing spring 119 brings about lack of pressing, and too strong spring force of the pressurizing spring 119 brings about buckling deformation. As a result, there is raised a poor positioning.

SUMMARY OF THE INVENTION

In view of the foregoing, it is an object of the present invention to provide an image exposure apparatus capable of setting up the optimum pressurizing at the conveying pin in accordance with the thickness or the width size of the printing plate and thereby preventing the buckling deformation and the poor positioning of the printing plate.

To achieve the above-mentioned object, the present invention provides an image exposure apparatus comprising:

a plate feed guide that conveys a printing plate for recording an image by an exposure head to a rotating drum for winding and a punch unit for forming punched holes to be used for positioning, the punch unit being provided upper the rotating drum;

a width direction moving unit that moves a conveying pin in a width direction of the printing plate while the conveying pin is in contact with a width direction edge of the printing plate, the width direction moving unit being put on the plate feed guide; and a reference pin disposed at an opposite side of the width direction moving unit for defining the width direction edge of the printing plate, wherein the width direction moving unit comprises:

a moving member moved by a driving motor in the width direction of the printing plate;

pressurizing means for enabling the conveying pin supported by the moving member in a direction of the printing plate;

a plurality of pin position detecting sensors that detects a moving position of the conveying pin wherein the moving member moves forward in the direction of the printing plate and the conveying pin is moved by coming into contact with the width direction edge of the printing plate; and control means having input means for entering a sort of the printing plate, the control means stopping the driving motor in accordance with a detection signal generated from the pin position detection sensor associated with the sort of the printing plate entered through the input means of the plurality of pin position detecting sensors.

According to the image exposure apparatus of the present invention as mentioned above, the positioning of the printing plate in the width direction is carried out in such a manner that in the state that the printing plate is put on the plate feed guide, the conveying pin is moved in the width direction of the printing plate to press the edge of the printing plate so that the printing plate bumps the reference pin.

At that time, the conveying pin is pushed by the edge of the printing plate and moves. When the first pin position detecting sensor detects the movement of the conveying pin, the driving motor stops by a signal of the control means based on the detection signal of the first pin position detecting sensor. Likely, when the second pin position detecting sensor detects the movement of the conveying pin, the driving motor stops by a signal of the control means based on the detection signal of the second pin-position detecting sensor. The detecting position of the first pin position detecting sensor is a detecting position involved in a case where the printing plate is of the thinnest or is large in width. The detecting position of the second pin position detecting sensor is a detecting position involved in a case where the printing plate is of the thickest or is small in width. Thus, according to the present invention, it is possible to apply the optimum pressurizing force of the conveying pin to the printing plate in accordance with the strength of the printing plate, and also to convey the printing plate with the optimum pressurizing force while preventing the buckling deformation of the printing plate.

In the image exposure apparatus according to the present invention as mentioned above, it is preferable that the pressurizing means comprises a connecting lever rotatably supported on the moving member, wherein the conveying pin is mounted on the connecting lever, and a pressurizing spring coupled with the connecting lever for enabling the conveying pin in the direction of the printing plate.

In the image exposure apparatus according to the present invention as mentioned above, it is preferable that the conveying pin is rotatably supported by the connecting lever.

In the image exposure apparatus according to the present invention as mentioned above, it is preferable that the pin position detecting sensors detect a connecting position of the connecting lever.

In the image exposure apparatus according to the present invention as mentioned above, it is preferable that the pin position detecting sensors detect the width direction edge of the printing plate.

In the image exposure apparatus according to the present invention as mentioned above, it is preferable that the width direction moving unit has an edge detecting sensor for detecting the width direction edge of the printing plate first when the moving member moves forward in the direction of the printing plate, the driving motor is changed over to a lower speed in accordance with an instruction of the control means based on a detection signal of the edge detecting sensor.

DETAILED DESCRIPTION OF PREFERRED EMBODIMENTS

Embodiments of the present invention will be described with reference to the accompanying drawings.

Figure 1:
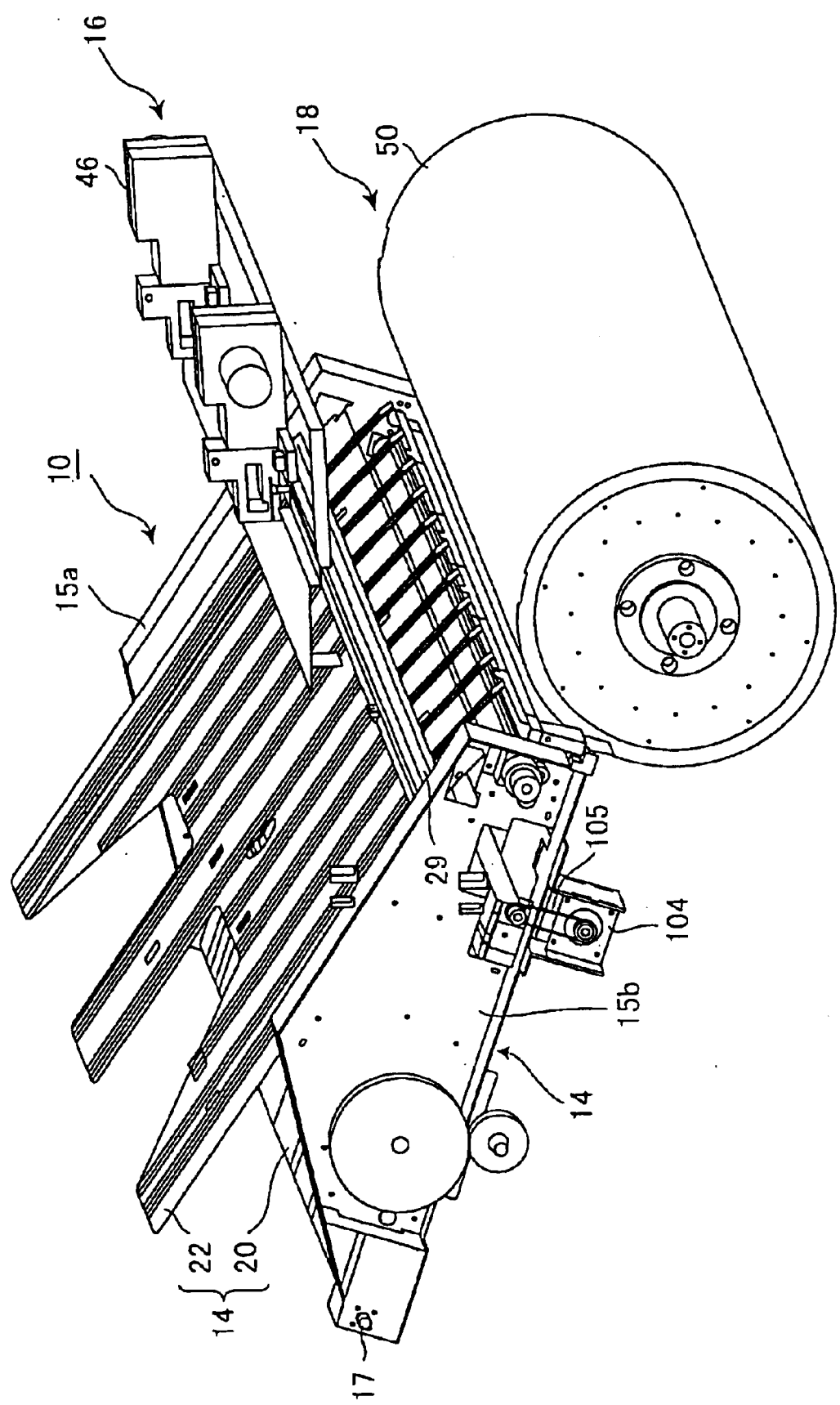
FIG. 1 is a perspective view of an image exposure apparatus according to an embodiment of the present invention.
Figure 2:
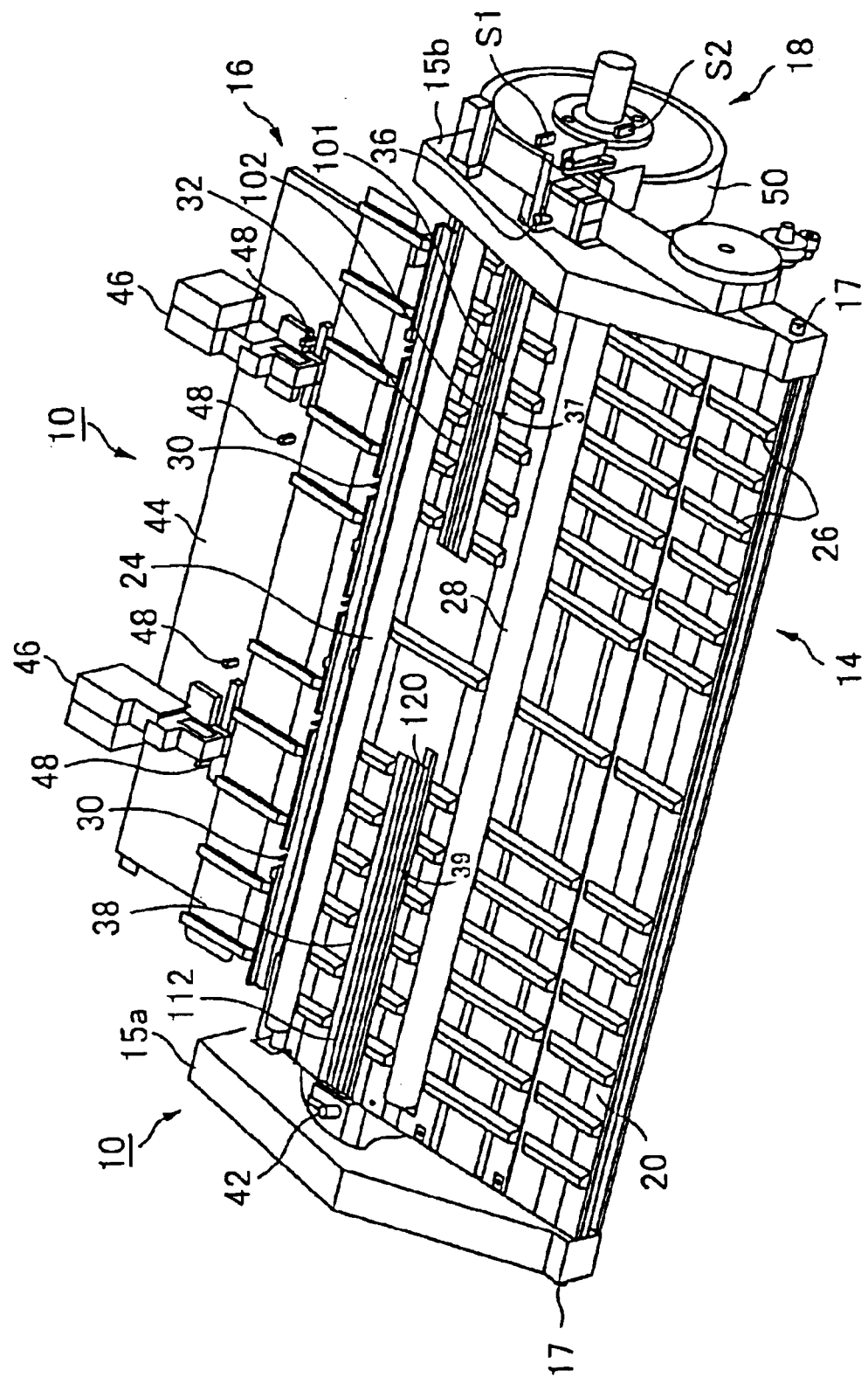
FIG. 2 is a perspective view of an image exposure apparatus according to an embodiment of the present invention, wherein a plate delivery guide is removed.
Figure 3:
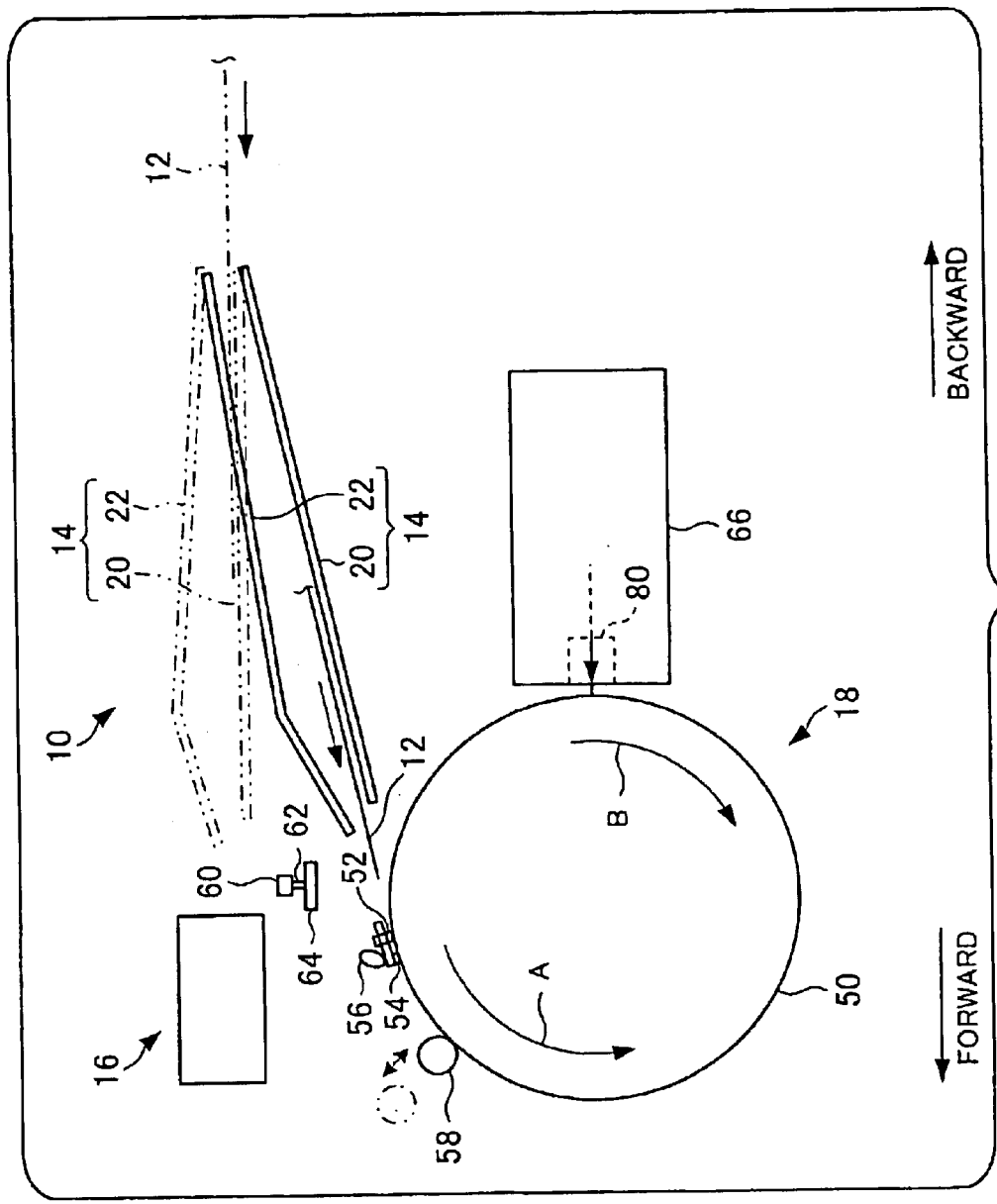
FIG. 3 is a schematic side view of an image exposure apparatus according to an embodiment of the present invention.

FIG. 1 is a perspective view of an image exposure apparatus 10 according to an embodiment of the present invention. FIG. 2 is a perspective view of an image exposure apparatus according to an embodiment of the present invention, wherein a plate delivery guide is removed. FIG. 3 is a schematic side view of an image exposure apparatus according to an embodiment of the present invention.

As shown in FIG. 1, FIG. 2 and FIG. 3, the image exposure apparatus 10 records (exposes) an image on an image forming layer (a sensitizing layer, an emulsion surface) of a printing plate 12 consisting of an aluminum foil sheet. In front of a conveying guide unit 14, there is disposed a punch section 16. And below the punch section 16, there is disposed an exposure section 18.

The conveying guide unit 14 comprises a plate feed guide 20 shaped as an approximately quadrilateral plate, a plate delivery guide 22 shaped as approximately quadrilateral plate, which is disposed on the upper portion of the plate feed guide 20, and left frame 15a and right frame 15b provided at both sides. As seen from FIG. 3, the relative position relation between the plate feed guide 20 and the plate delivery guide 22 offers an alphabetical V figure.

The conveying guide unit 14 rotatably moves by a predetermined angle on a fulcrum 17 provided on the rear end portion in FIG. 1 to FIG. 2. This rotatable movement makes it possible that the plate feed guide 20 and the plate delivery guide 22 selectively face the punch section 16 and the exposure section 18.

As shown in FIG. 2, at the front portion of the plate feed guide 20, there are provided cylindrical front conveying roller 24 and back conveying roller 28 in such a manner that they are rotatable and project onto the plate feed guide 20. When the front conveying roller 24 and back conveying roller 28 rotate, the printing plate 12 put on the plate feed guide 20 is conveyed forward.

As shown in FIG. 2, on the plate feed guide 20, there are provided a large number of trapezoidal columnar ribs 26. Those ribs 26 are disposed in parallel with respect to the lateral direction, and is set up in such a manner that height of the rib in projection onto the plate feed guide 20 is slightly lower than the front conveying roller 24. The use of the ribs 26 contributes to reduction of the frictional force involved in conveyance of the printing plate 12 by rotation of the conveying roller 28.

At the front of the plate feed guide 20, a plurality of provisional positioning pins 30 form a line in a horizontal direction. Each of the provisional positioning pins 30, which is columnar, is rotatable on the center shaft and projects over an upper surface of the plate feed guide 20 on a disappearing basis. As mentioned above, when the conveying roller 24 conveys the printing plate 12 forward, the front edge of the printing plate 12 bumps against the provisional positioning pins 30. Thus, a positioning of the front edge of the printing plate 12 is carried out. When the provisional positioning pins 30 go down, it is possible that the conveying roller 24 causes the printing plate 12 to be conveyed forward over the front edge of the plate feed guide 20. Thereafter, as will be mentioned later, positioning pins 48 of a punch unit 46 carries out regular positioning.

At the right side of the plate feed guide 20, there is formed a-slit 32, which is substantially parallel with the conveying rollers 24 and 28 in the vicinity of the rear side of the conveying roller 24. Below the slit 32, there is disposed a reference pin moving unit 37 (cf. FIG. 4) in parallel with the slit 32.

Figure 4:
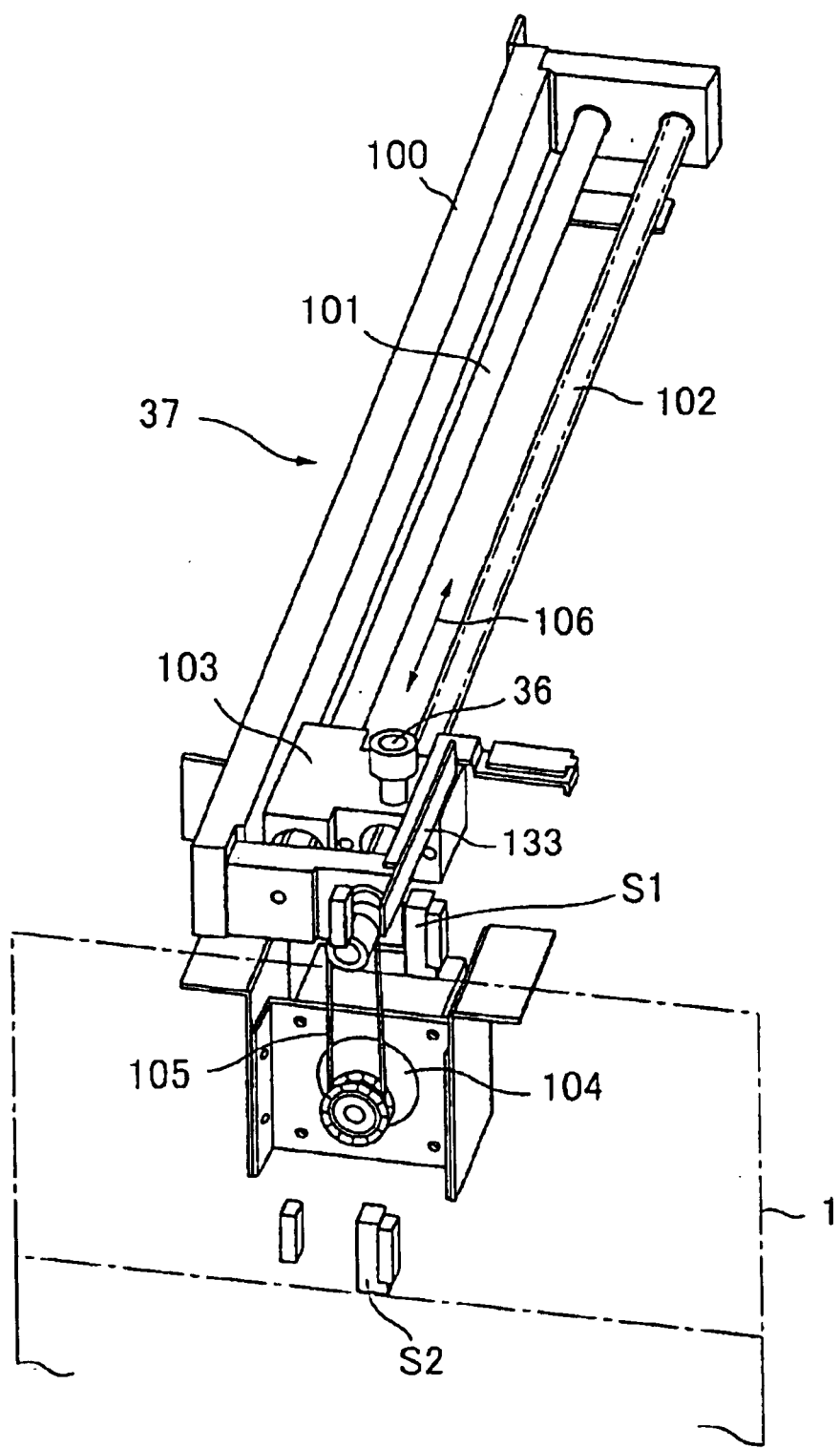
FIG. 4 is a perspective view of a reference pin-moving unit.

FIG. 4 is a perspective view of a reference pin moving unit 37. As shown in FIG. 4, the reference pin moving unit 37 comprises a guide member 101 fixed on a frame 100, and a feed screw 102 rotatably mounted on the frame 100, the feed screw 102 being in parallel to the guide member 101. A moving member 103 is slidably mounted on the guide member 101 and is screwed to the feed screw 102. A reference pin 36 is rotatably mounted on the top of the moving member 103 and projects over the slit 32. The feed screw 102 is driven by a driving motor 104 installed in the frame 100 via a timing belt 105, so that the moving member 103 reciprocates in an arrow 106 and the reference pin 36 reciprocates projecting from the slit 32.

The reference pin 36 is located at a home position of the right end of the plate feed guide 20 beforehand (a detecting position of a home position sensor S1). A criterion of the right end of the printing plate 12 is determined in such a manner that the reference pin 36 moves from the home position to the left in accordance with a size of the printing plate 12 put on the plate feed guide 20.

Again referring to FIG. 2, at the left side of the plate feed guide 20, there is formed a slit 38 substantially in parallel to the front conveying roller 24 and the back conveying roller 28. Below the slit 38, there is disposed a width direction moving unit 39 (cf. FIG. 5) in parallel to the slit 38.

Figure 5:
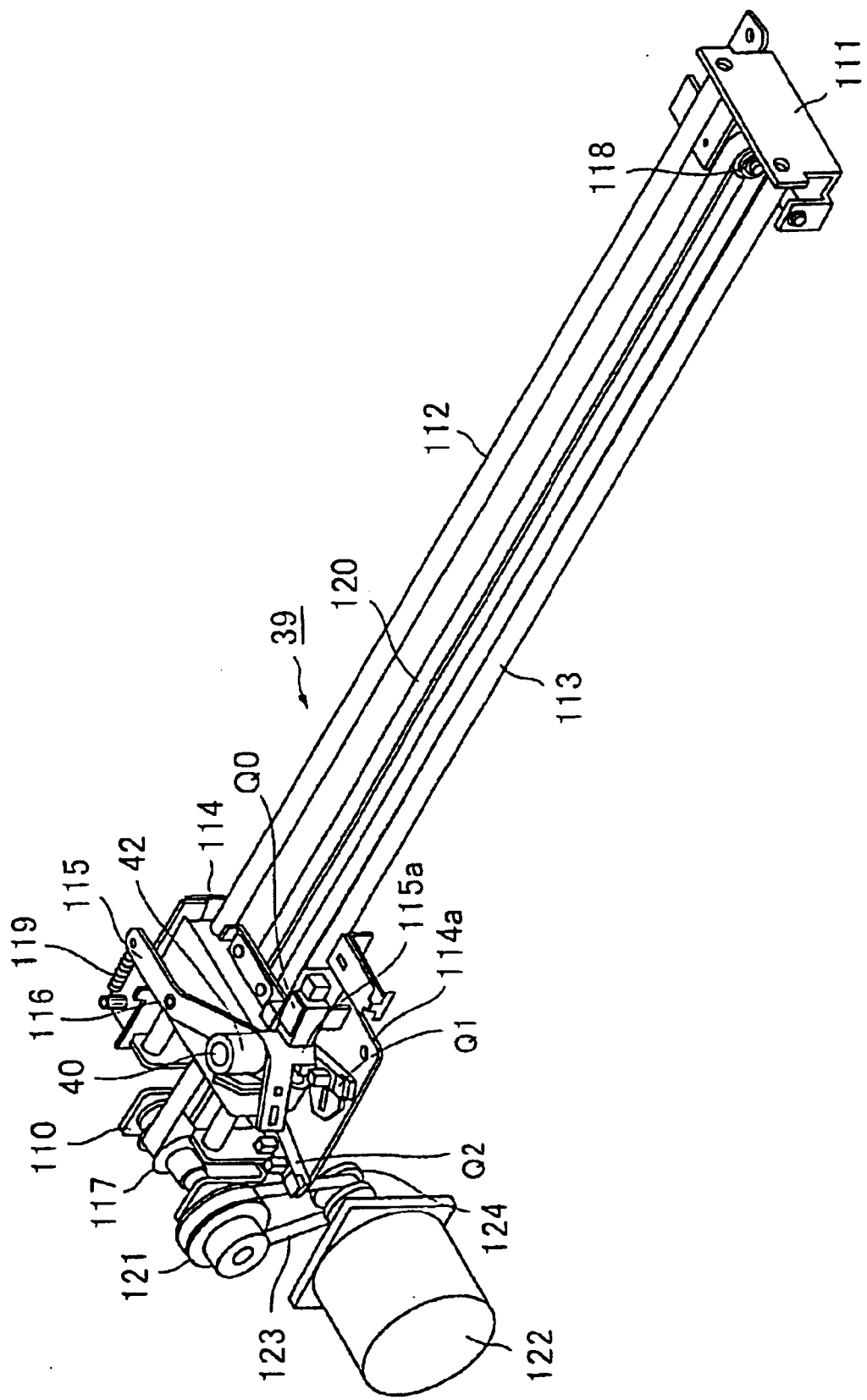
FIG. 5 is a perspective view of a width direction moving unit image exposure apparatus.

FIG. 5 is a perspective view of the width direction moving unit 39.

The width direction moving unit 39 comprises guide members 112 and 113 fixed between frames 110 and 111, and a moving member 114 which is movably mounted on the guide members 112 and 113. At the upper portion of the moving member 114, a connecting lever 115 is rotatably mounted on a fulcrum 116. A columnar conveying pin 42 is rotatably supported on a support shaft 40 of the connecting lever 115. The conveying pin 42 projects from the slit 38. A pressurizing spring 119 enables the connecting lever 115 anticlockwise in FIG. 5, that is, in a direction that the conveying pin 42 moves forward.

A first timing belt 120 is built between pulleys 117 and 118 provided on the frames 110 and 111, respectively. The moving member 114 is fixed on the first timing belt 120. A driving pulley 121 is installed in a shaft of the pulley 117 provided on the frame 111. A second timing belt 123 is built between the driving pulley 121 and a motor pulley 124 of a driving motor 122 mounted on the frame 110.

A plate receiving section 114a, which is formed at one side of the moving member 114, is provided with an edge detection sensor Q0 for detecting an edge of the printing plate 12, and first pin position detecting sensor Q1 and second pin position detecting sensor Q2 for detecting a moving position of the conveying pin 42.

The edge detection sensor Q0 first detects the edge of the printing plate 12 when the frame 110 of the width direction moving unit 39 moves in the direction of the printing plate 12. The first pin position detecting sensor Q1 and the second pin position detecting sensor Q2 detect a moving position of the conveying pin 42 when the conveying pin 42 is pushed by the edge of the printing plate 12. According to the embodiment shown in FIG. 5, the first pin position detecting sensor Q1 and the second pin position detecting sensor Q2 detect a movement of a detection segment 115a integrated with the connecting lever 115.

Next, there will be explained an operation of the positioning of the printing plate at the time of punching.

In FIG. 3, the conveying guide unit 14 goes up to the position depicted by the two-dot chain line. First, the printing plate 12 is put on the plate feed guide 20. In this state, the conveying rollers 24 and 28 conveys the printing plate 12 forward so that the printing plate 12 bumps positioning pins 48 to carry out a positioning of the front edge of the printing plate 12. Next, in the state that while the conveying rollers 24 and 28 rotate, the printing plate 12 slips, the conveying pin 42 moves along the slit 38 in the right direction so that the printing plate 12 is conveyed in the right direction by pressing of the left edge of the printing plate 12 to bump the reference pin 36. Thus, it is possible to determine a position of the printing plate 12 in the right direction. In this manner, a positioning for the printing plate 12 is carried out. At that time, the pressurizing spring 119 applies a predetermined elastic force to the reference pin 36.

According to the present invention, varying the pressurizing force by the pressurizing spring 119 to meet the sort of the printing plate 12 makes it possible to prevent the buckling deformation of the printing plate 12.

Figure 9:
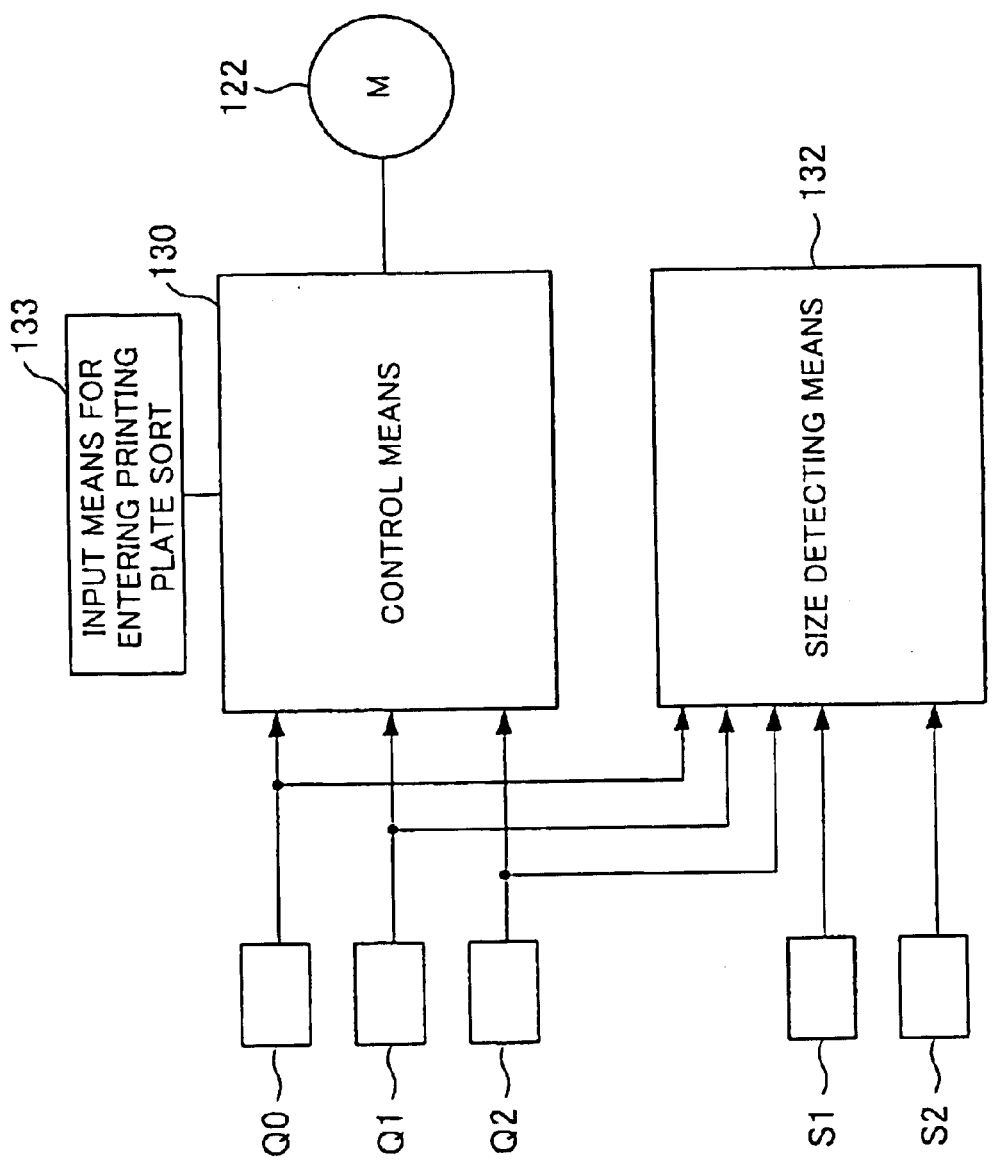
FIG. 9 is a circuit diagram of a control circuit for pressurizing force setting and size detection.
Figure 10:
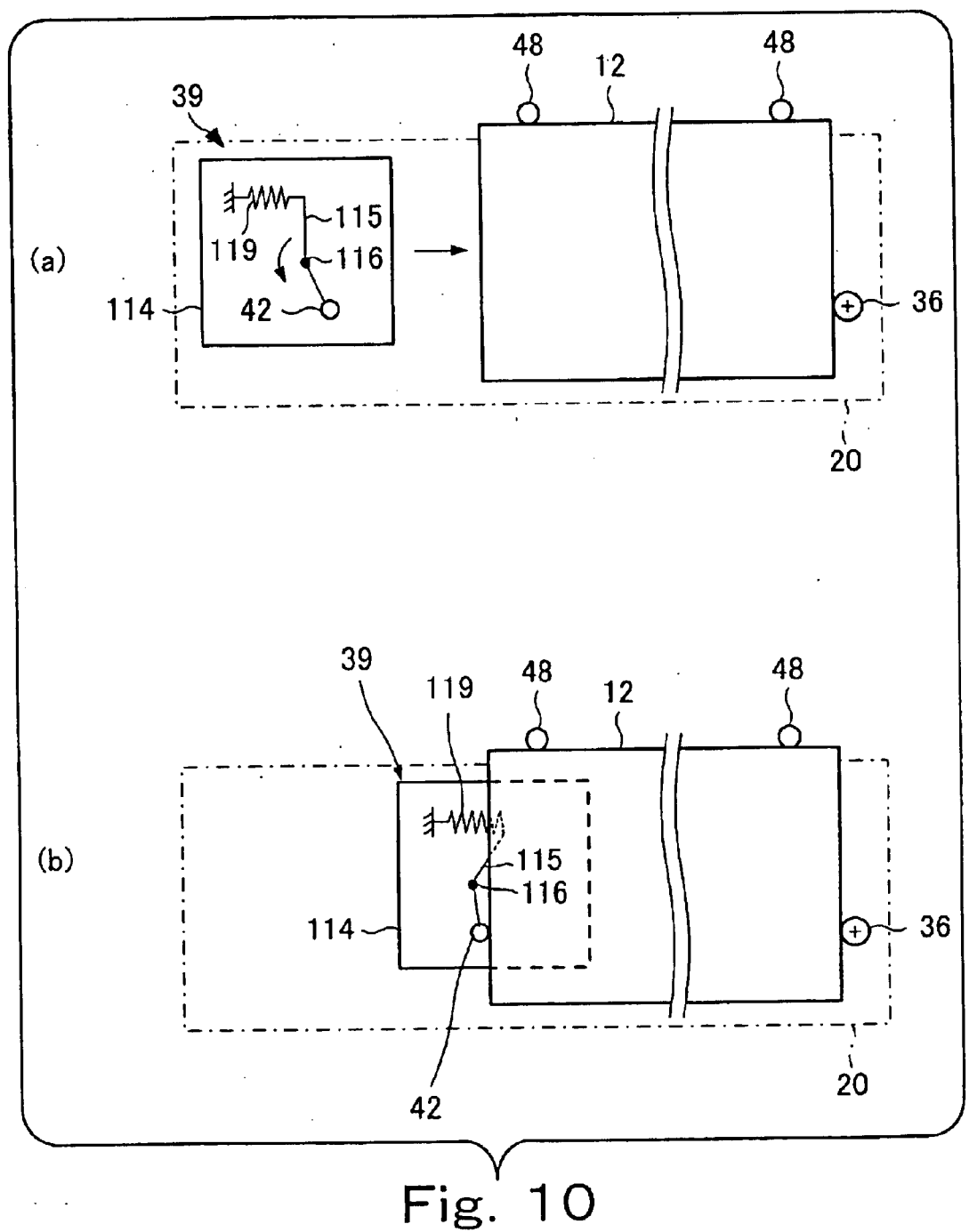
FIG. 10 is an explanatory view useful for understanding a step of positioning of a printing plate according to the related art.

FIG. 9 is a circuit diagram of a control circuit for pressurizing force setting and size detection.

As shown in FIG. 9, connected to control means 130 is input means 133 for entering the edge detection sensor Q0, the first pin position detecting sensor Q1 and the second pin position detecting sensor Q2, and the sort (size, thickness and the like) of the printing plate 12. The input means 133 sets up beforehand one to be used from among the first pin position detecting sensor Q1 and the second pin position detecting sensor Q2.

Figure 6:
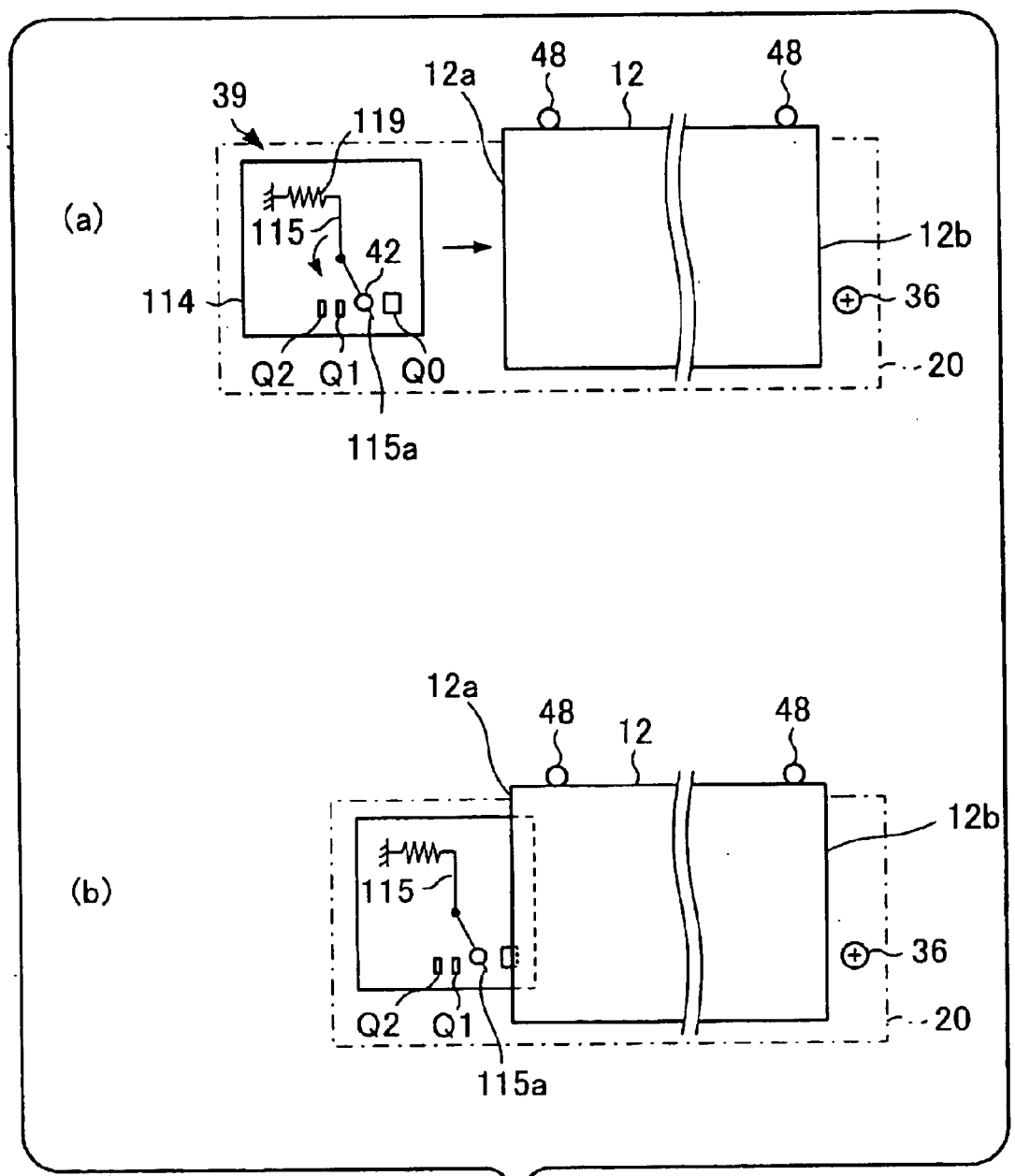
FIG. 6 is an explanatory view useful for understanding a step of positioning of a printing plate.
Figure 7:
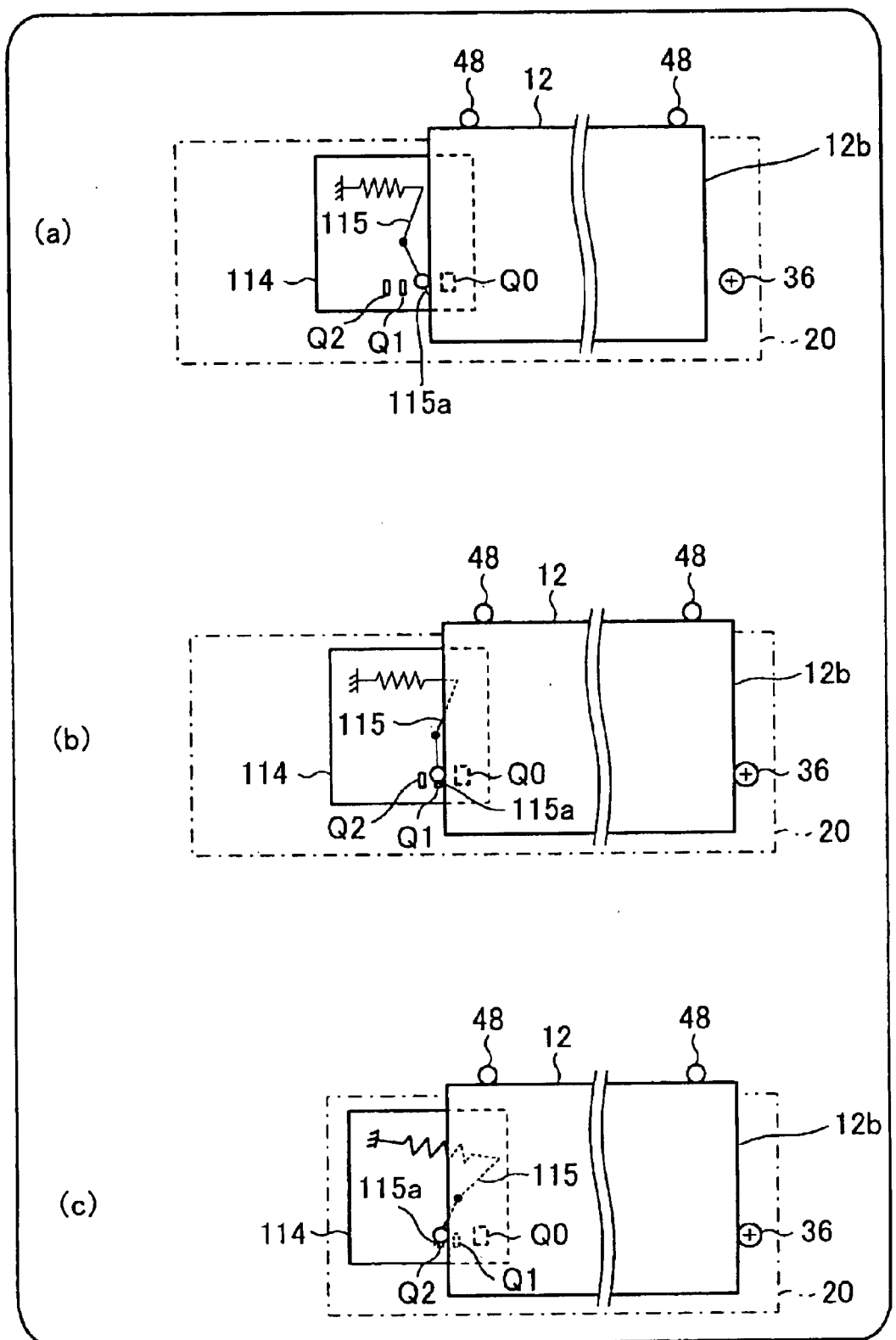
FIG. 7 is an explanatory view useful for understanding a step of positioning of a printing plate, which is successive to FIG. 6.

FIG. 6 is an explanatory view useful for understanding a step of positioning of a printing plate. FIG. 7 is an explanatory view useful for understanding a step of positioning of a printing plate, which is successive to FIG. 6.

In part (a) of FIG. 6, when the moving member 114 starts to move toward the printing plate 12, and as shown in part (b) of FIG. 6, the edge detection sensor Q0 detects the edge of the printing plate 12, a driving motor 122 is changed over in operational speed to a low speed based on a detection signal of the edge detection sensor Q0 in accordance with an instruction of-the control means 130 shown in FIG. 9, so that the moving member 114 moves forward at the reduced speed, and as shown in part (a) of FIG. 7, the impact, wherein the conveying pin 42 bumps the edge 12a, is eased. Thus, the shock to the edge 12a of the printing plate 12 is suppressed. In a state of the reduced speed, the printing plate 12 moves until the edge 12b of the printing plate 12 bumps the reference pin 36. Thus, the shock to the edge 12b of the printing plate 12 from the reference pin 36 is also suppressed.

Next, as shown in part (b) of FIG. 7, the conveying pin 42 is pushed by the edge 12a so that the connecting lever 115 swings, and the first pin position detecting sensor Q1 detects the detection segment 115a (cf. FIG. 5). Then, the driving motor 122 is stopped in accordance with a signal of the control means 130 based on a detection signal of the first pin position detecting sensor Q1. The input means 133 and the control means 130 set up that the first pin position detecting sensor Q1 is used for detection wherein the printing plate 12 is of the thinnest (for example, 0.15 mm) or is large in width. At this position, the pressurizing spring 119 is relatively weak in its spring force, and thus it is possible to prevent the buckling deformation even if the printing plate 12 is small in its strength.

Next, as shown in part (c) of FIG. 7, when the second pin position detecting sensor Q2 detects the detection segment 115a (cf. FIG. 5). Then, the driving motor 122 is stopped in accordance with a signal of the control means 130 based on a detection signal of the second pin position detecting sensor Q2. The input means 133 and the control means 130 set up that the second pin position detecting sensor Q2 is used for detection wherein the printing plate 12 is of the thickest (for example, 0.4 mm) or is small in width. At this position, the pressurizing spring 119 is relatively strong in its spring force, and thus it is possible to prevent the buckling deformation since the printing plate 12 is large in its strength.

According to the structure as mentioned above, a movement of the detection segment 115a of the connecting lever 115 is detected. It is acceptable, however, that the first pin position detecting sensor Q1 and the second pin position detecting sensor Q2 directly detect the edge 12a of the printing plate 12 wherein the conveying pin 42 bumps the printing plate 12 to be pushed.

In the event that the first pin position detecting sensor Q1 and the second pin position detecting sensor Q2 directly detect the edge 12a of the printing plate 12, as shown in FIG. 9, it is possible to detect a size of the printing plate 12 in the width direction in such a manner that the signals from the home position sensors S1 and S2 for detecting the starting position of the reference pin 36 and the edge detection signals from the edge detection sensor Q0, the first pin position detecting sensor Q1 and second pin position detecting sensor Q2 are entered to the size detecting means 132.

Incidentally, the number of pin position detecting sensors is optional. It is possible to increase the number of pin position detecting sensors in accordance with the increment of the sort of the printing plate 12.

Again referring to FIG. 1 to FIG. 3, a punch section 16 has a predetermined number of punch units 46 (in this case, two punch units) provided on a supporting plate 44. When the plate feed guide 20 of the conveying guide unit 14 faces the punch units 46 and the provisional positioning pins 30 go down from the side of the plate feed guide 20, the front edge portion of the printing plate 12 is conveyed from the plate feed guide 20 into the punch units 46 by the conveying roller 24.

At the front of each of the punch units 46, there is provided a positioning pins 48. The front edge of the printing plate 12, which is to be conveyed into the punch units 46, bumps the positioning pins 48, so that the position of the printing plate 12 in the front and back directions is determined. In this state, in other words, the state that while the conveying rollers 24 and 28 rotate, the printing plate 12 slips and is in contact with the positioning pins 48, the conveying pin 42 again moves so that the printing plate 12 is conveyed in the right direction to bump the reference pin 36. Thus, it is possible to determine a position of the printing plate 12 in the width direction. In this manner, as shown in the part (b) of FIG. 7, the punch section 16 carries out the regular positioning. The center line (as to the right and left direction) of the printing plate 12 thus carried out in the regular positioning is coincident with the center line (as to the right and left direction) of the plate feed guide 20.

When the punch unit 46 terminates the processing, the printing plate 12 is returned onto the plate feed guide 20 through the reverse rotation of the conveying roller 24, and the provisional positioning pins 30 project from the upper side so that the provisional positioning of the printing plate 12 is carried out in the manner as mentioned above.

Again referring to FIG. 1 and FIG. 2, the exposure section 18 is provided with a columnar rotating drum 50. When the provisional positioning of the printing plate 12, which is returned from the punch section 16 to the plate feed guide 20, is carried out in the manner as mentioned above, the conveying guide unit 14 goes down in the front edge and rotatably moves to the position depicted by the solid line in FIG. 3, so that the plate feed guide 20 is directed tangential to the rotating drum 50 and the provisional positioning pins 30 go down from the upper side of the plate feed guide 20. In this condition, the printing plate 12 (depicted by the solid line) is conveyed by the conveying roller 24 so that the front edge of the printing plate 12 is located at the periphery of the rotating drum 50.

Figure 8:
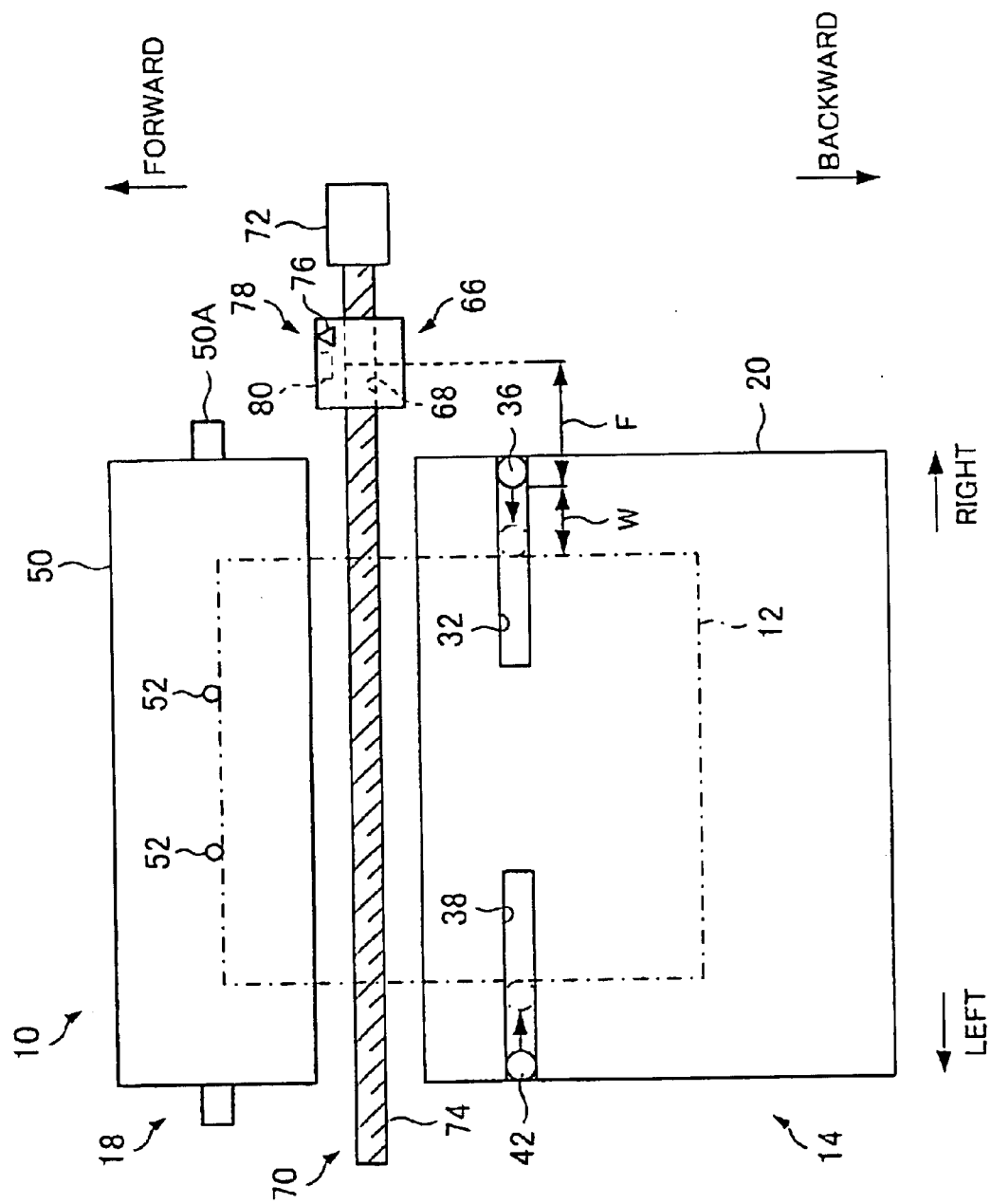
FIG. 8 is a plan view of essential portions of an image exposure apparatus according to an embodiment of the present invention.

FIG. 8 is a plan view of essential portions of an image exposure apparatus according to an embodiment of the present invention.

As shown in FIG. 8, on the periphery of the rotating drum 50 there is provided a plurality of drum positioning pins 52. The front edge of the printing plate 12, which is conveyed onto the periphery of the rotating drum 50, bumps against the drum positioning pins 52, so that the position of the printing plate 12 in the front and back direction is determined. In this state, the conveying pin 42 moves so that the printing plate 12 is conveyed in the right direction to bump the reference pin 36. Thus, it is possible to determine a position of the printing plate 12 in the right direction. In this manner, as shown in FIG. 8, the exposure section 18 carries out the regular positioning. An arrangement position of the drum positioning pins 52 is coincident with an arrangement position of the positioning pins 48 in the front and back direction and the right and left direction. The position wherein the printing plate 12 subjected to the regular positioning by the punch section 16 bumps the positioning pins 48 and the reference pin 36 and the position wherein the printing plate 12 subjected to the regular positioning by the exposure section 18 bumps a pair of positioning pins 52 and the reference pin 36 are set to the same position.

As shown in FIG. 3, on the periphery of the rotating drum 50 there is provided a front edge chuck 54 in the vicinity of the positioning pins 52. At the upper portion of the front edge chuck 54 there is provided a mounting cam 56. When the mounting cam 56 presses the front side of the front edge chuck 54, the rear side of the front edge chuck 54 is separated from the periphery of the rotating drum 50. Thus, as mentioned above, the front edge of the printing plate, which is conveyed from the plate feed guide 20 to the periphery of the rotating drum 50, is inserted between the rear side of the front edge chuck 54 and the periphery of the rotating drum 50. In this condition, the regular positioning for the printing plate 12 is carried out.

After the regular positioning for the printing plate 12 is completed, the mounting cam 56 rotatably moves to release the pressure of the front edge chuck 54, so that the rear side of the front edge chuck 54 rotatably moves by a spring (not illustrated) provided inside the front edge chuck 54. Thus, the front edge of the printing plate 12 is pressed so that the front edge of the printing plate 12 is maintained onto the periphery of the rotating drum 50. When the front edge of the printing plate 12 is maintained onto the periphery of the rotating drum 50, the rotating drum 50 is rotated in the direction of the arrow A in FIG. 2, so that the printing plate.12 is wound on the periphery of the rotating drum 50.

In the vicinity of the periphery of the rotating drum 50, there is disposed a squeeze roller 58, which is detachably in contact with the rotating drum 50, in the direction of the arrow A in FIG. 3 with respect to the mounting cam 56. When the squeeze 58 moves to the side of the rotating drum 50, the squeeze 58 presses the printing plate 12, which is to be wound on the rotating drum 50, toward the rotating drum 50 and rotates, so that the printing plate 12 is closely in contact with the periphery of the printing plate 12.

In the vicinity of the periphery of the rotating drum 50, there is disposed a rear edge chuck detachable unit 60 in the direction of the arrow B in FIG. 3 with respect to the cam 56. The rear edge chuck detachable unit 60 has a shaft 62, which is movable to the rotating drum 50. A rear edge chuck 64.is mounted on the top of the shaft 62. When the rear edge of the printing plate 12 wound on the rotating drum 50 faces the rear edge chuck detachable unit 60, the shaft 62 causes the rear edge chuck 64 to move to the rotating drum 50 side so that the rear edge chuck 64 is mounted on a predetermined position of the rotating drum 50 and the rear edge chuck 64 is detached from the shaft 62. In this manner, the rear edge chuck 64 presses the rear edge of the printing plate 12, so that the rear edge of the printing plate 12 is maintained on the periphery of the rotating drum 50.

In this manner, when the front edge chuck 54 and the rear edge chuck 64 serve to maintain the front edge and the rear edge of the printing plate 12 on the rotating drum 50, the rotating drum 50 rotates at a predetermined rotating speed after the squeeze roller 58 is detached from the rotating drum 50.

As shown in FIG. 8, In the vicinity of the periphery of the rotating drum.50, there is disposed a recording head section 66 as an image recording section. The recording head section 66 is provided with a female screw 68. In the vicinity of the periphery of the rotating drum 50, there is disposed a shaft 70 along the shaft line direction (the horizontal direction) of the rotating drum. One end (the right side in the present embodiment) of the shaft 70 is coupled with a pulse motor 72 (a stepping motor), so that driving of the pulse motor 72 makes it possible that the shaft 70 rotates. The female screw 68 of the recording head section 66 is engaged with the shaft 70 on a spiral basis, so that the recording head section 66 is supported in a state that the recording head section 66 stands on the shaft 70. When the shaft 70 rotates by the drive of the pulse motor 72, the recording head section 66 moves in the shaft line direction of the rotating drum 50 maintaining the state that the recording head section 66 stands on the shaft 70.

The recording head section 66 is provided with a head home position-detecting sensor 76. When the head home position-detecting sensor 76 detects a home position mark 78 which is disposed at a predetermined position in the vicinity of the rotating drum 50, the recording head section 66 is disposed on a home position.

In the recording head section 66, a light beam, which is modulated in accordance with the read image data, is projected from an irradiation lens 80 to the rotating drum 50 to be rotated at high speed in synchronism with the rotation of the rotating drum 50, so that the printing plate 12 is exposed in accordance with the image data. This exposure processing is a so-called scanning exposure processing that while the rotating drum 50 is rotated at high speed (the main scanning), the recording head section 66 is moved to the shaft line direction of the rotating drum 50 (the sub-scanning).

In this case, W+F=an initial migration length from the home position of the recording head section 66 to the left hand, where W denotes a distance wherein the reference pin 36 moves from the starting position (the right edge portion of the plate feed guide 20) to the left hand for positioning, and F denotes an offset amount of the irradiation lens 80 of the recording head section 66 disposed at the home position to the reference pin 36 disposed at the starting position to the right hand. Thus, the starting position (the exposure starting position) for image recording (depiction) of the printing plate is determined.

Further, the rotating position of the rotating drum 50 is determined through computation of rotating position data by an encoder (not illustrated) disposed at a rotary shaft 50A of the rotating drum 50.

When the scanning exposure to the printing plate 12 is terminated, the rotating drum 50 temporarily stops in its rotating operation at the position that the rear edge chuck 64 faces the shaft 62 to remove the rear edge chuck 64 from the rotating drum 50 (the rear edge chuck 64 is mounted on the shaft 62), so that the pressure to the rear edge of the printing plate 12 by the rear edge chuck 64 is released. Further, after the conveying guide unit 14 rotatably moves and the plate delivery guide 22 faces the exposure section 18 (the plate delivery guide 22 is directed to the tangential direction to the rotating drum 50 as shown in FIG. 3, the rotating drum 50 rotates in the direction as indicated by the arrow B in FIG. 3). Thus, the printing plate 12 is delivered from the rear edge side to the plate delivery guide 22. At that time, the cam 56 rotatably moves to press the front side of the front edge chuck 54, so that the pressure to the front edge of the printing plate 12 by the back side of the front edge chuck 54 is released. When the printing plate 12 is transmitted to the plate delivery guide 22, the conveying roller 29 rotatably moves to deliver the printing plate 12 from the plate delivery guide 22, so that the printing plate 12 is conveyed to a developing unit or a printing unit (not illustrated) involved in the subsequent step adjacent to the image exposure apparatus 10.

Next, there will be explained the operation of positioning of the printing plate 12 in an image exposure apparatus according to the present embodiment.

The conveying guide unit 14 goes up the position depicted by the two-dot chain line in FIG. 3 (the initial state). First, a sort of the printing plate 12, specifically, size information such as length, width and thickness of the printing plate 12 is entered to the control means 130 through input means 133 for entering printing plate sort. As the input means 133 for entering printing plate sort, it is possible to adopt a numerical input means such as a keyboard. However, it is acceptable to adopt an automatic input means by a computer according to a detection of an automatic detection sensor for a printing plate size.

When the printing plate sort is entered, either one of the first pin position detecting sensor Q1 and the second pin position detecting sensor Q2 is enabled in accordance with the entered printing plate 12. Next, the printing plate 12 is put on the plate feed guide 20. At that time, it is acceptable that putting of the printing plate 12 on the plate feed guide 20 is carried out manually or on a basis of feeding by an automatic paper feeding unit. The printing plate 12 is put on the plate feed guide 20 in a relatively rough state. In this state, the conveying rollers 24 and 28 convey the printing plate 12 forward so that the front edge of the printing plate 12 bumps against the provisional positioning pins 30. Thereafter, the conveying rollers 24 and 28 rotate and the printing plate 12 slips. In this condition, the reference pin 36 moves by the migration length computed in accordance with size information (width size information) to set up a reference position. Next, the conveying pin 42 serves to move the printing plate 12 in the right direction so that the printing plate 12 bumps the reference pin 36 and whereby the provisional positioning of the printing plate 12 is carried out.

In the state of the provisional positioning (the position depicted by the two-dot chain line in FIG. 3), the plate feed guide 20 of the conveying guide unit 14 faces the punch section 16. When the provisional positioning pins 30 go down from the upper side of the plate feed guide 20, the conveying rollers 24 and 28 convey the printing plate 12 forward so that the front edge of the printing plate 12 bumps a pair of positioning pins 48 of the punch section 16. Thereafter, the conveying rollers 24 and 28 rotate and the printing plate 12 slips. In this state, the reference pin 36 moves by the migration length computed in accordance with the size information (width size information) in the manner as mentioned above to set up the reference position.

Next, the conveying pin 42 conveys the printing plate 12 to the right hand. When the printing plate 12 bumps the reference pin 36, the punch section 16 carries out the regular positioning in the state that the printing plate 12 is put on the plate feed guide 20. After the punch unit 46 forms a predetermined number of punched holes on the front edge of the printing plate 12 thus determined in positioning, the printing plate 12 is returned onto the plate feed guide 20 through the reverse rotation of the conveying roller 24, and a pair of provisional positioning pins 30 is projected from the upper side of the plate feed guide 20. Thus, the provisional positioning for the printing plate 12 is carried out in a similar fashion to that as mentioned above.

In the state of the provisional positioning, the conveying guide unit 14 rotates so that the plate feed guide 20 is associated with the exposure section 18 (the position depicted by the solid line), and a pair of provisional positioning pins 30 goes down from the upper side of the plate feed guide 20. Then the conveying roller 24 conveys the printing plate 12 forward so that the front edge of the printing plate,12 bumps a pair of positioning pins 52 of the rotating drum 50. Thereafter, the conveying rollers 24 and 28 rotate and the printing plate 12 slips. In this state, the conveying pin 42 conveys the printing plate 12 to the right hand. When the printing plate 12 bumps the reference pin 36, the exposure section 18 carries out the regular positioning in the state that the printing plate 12 is put on the plate feed guide 20. At that time, as mentioned above, the pressurizing force applied to the printing plate 12 is varied with the detection of the first pin position detecting sensor Q1 and the second pin position detecting sensor Q2.

The printing plate 12, which is subjected to the regular positioning in the manner as mentioned above, is maintained on the periphery of the rotating drum 50 by the front edge chuck 54 and the rear edge chuck 64 in the front edge and the rear edge, and is wound around the periphery of the rotating drum 50 while being closely in contact with the periphery of the rotating drum 50 by the squeeze roller 58. Thereafter, the rotating drum 50 is rotated at high speed so that the recording head section 66 carries out the exposure processing.

When the exposure processing is terminated, the conveying guide unit 14 is rotatably moved so that the plate delivery guide 22 is associated with the rotating drum 50, and the printing plate 12 is discharged from the rotating drum 50 to the plate delivery guide 22 while releasing the holding of the printing plate 12 on the periphery of the rotating drum 50 by the front edge chuck 54 and the rear edge chuck 64. Thereafter, the conveying guide unit 14 is rotatably moved so that the printing plate 12 is conveyed from the plate delivery guide 22 to the developing unit or the printing unit.

There is established such a setting up that a relative position relation (a first relative position relation) between the positioning pins 48 and the reference pin 36 wherein the printing plate 12 bumps the positioning pins 48 and the reference pin 36, and the regular positioning is carried out, in the punch section 16, is equal to a relative position relation (a second relative position relation) between the positioning pins 52 and the reference pin 36 wherein the printing plate 12 bumps the positioning pins 52 and the reference pin 36, and the regular positioning is carried out, in the exposure section 18. For this reason, even if the edge of the printing plate 12 has a bend, it is possible to make a coincidence between the regular positioning position of the printing plate 12 in the punch section 16 and the regular positioning position of the printing plate 12 in the exposure section 18. And thus, it is possible to make a coincidence between the printing position of the printing plate 12, which is determined by a predetermined number of punched holes, and the exposure position (the image recording position) of the printing plate 12.

Incidentally, according to the present embodiment, the conveying guide unit 14 is rotatably and movably supported via the shaft 17. However, it is acceptable to provide such an arrangement that the conveying guide unit 14 is moved in a vertical direction by a guide rail (not illustrated). In case of such an arrangement, it is effective that the angle setting of the conveying guide unit 14 is replaced by the position setting in the height direction of the conveying guide unit 14.

As mentioned above, according to the present invention, it is possible to set up the optimum pressurizing force of the conveying pin to the printing plate by the pressurizing spring in accordance with the thickness or the width size of the printing plate, and thereby carrying out the positioning while preventing the buckling deformation always with suitable pressurizing force even if the sort of the printing plate is increased.

Although the present invention has been described with reference to the particular illustrative embodiments, it is not to be restricted by those embodiments but only by the appended claims. It is to be appreciated that those skilled in the art can change or modify the embodiments without departing from the scope and sprit of the present invention.

What is claimed is:

1. An image exposure apparatus comprising:

a plate feed guide that conveys a printing plate for recording an image by an exposure head to a rotating drum for winding and a punch unit for forming punched holes to be used for positioning, the punch unit being provided upper the rotating drum;

a width direction moving unit that moves a conveying pin in a width direction of the printing plate while the conveying pin is in contact with a width direction edge of the printing plate, the width direction moving unit being put on the plate feed guide; and a reference pin disposed at an opposite side of the width direction moving unit for defining the width direction edge of the printing plate, wherein the width direction moving unit comprises:

a moving member moved by a driving motor in the width direction of the printing plate;

pressurizing means for enabling the conveying pin supported by the moving member in a direction of the printing plate;

a plurality of pin position detecting sensors that detects a moving position of the conveying pin wherein the moving member moves forward in the direction of the printing plate and the conveying pin is moved by coming into contact with the width direction edge of the printing plate; and control means having input means for entering a sort of the printing plate, the control means stopping the driving motor in accordance with a detection signal generated from the pin position detection sensor associated with the sort of the printing plate entered through the input means of the plurality of pin position detecting sensors.

2. An image exposure apparatus according to claim 1, wherein the pressurizing means comprises a connecting lever rotatably supported on the moving member, wherein the conveying pin is mounted on the connecting lever, and a pressurizing spring coupled with the connecting lever for enabling the conveying pin in the direction of the printing plate.

3. An image exposure apparatus according to claim 2, wherein the conveying pin is rotatably supported by the connecting lever.

4. An image exposure apparatus according to claim 2, wherein the pin position detecting sensors detect a connecting position of the connecting lever.

5. An image exposure apparatus according to claim 1, wherein the pin position detecting sensors detect the width direction edge of the printing plate.

6. An image exposure apparatus according to claim 1, wherein the width direction moving unit has an edge detecting sensor for detecting the width direction edge of the printing plate first when the moving member moves forward in the direction of the printing plate, the driving motor is changed over to a lower speed in accordance with an instruction of the control means based on a detection signal of the edge detecting sensor.

* * * * *